United States Patent
Fan

(10) Patent No.: US 9,621,146 B2
(45) Date of Patent: Apr. 11, 2017

(54) DIGITAL CURRENT EQUALIZATION METHOD AND POWER SUPPLY MODULE

(71) Applicant: HUAWEI TECHNOLOGIES CO., LTD., Shenzhen, Guangdong (CN)

(72) Inventor: Xiaodong Fan, Shenzhen (CN)

(73) Assignee: HUAWEI TECHNOLOGIES CO., LTD., Shenzhen, Guangdong (CN)

( * ) Notice: Subject to any disclaimer, the term of this patent is extended or adjusted under 35 U.S.C. 154(b) by 125 days.

(21) Appl. No.: 14/586,109

(22) Filed: Dec. 30, 2014

(65) Prior Publication Data

US 2015/0180332 A1    Jun. 25, 2015

Related U.S. Application Data

(63) Continuation of application No. PCT/CN2014/081837, filed on Jul. 8, 2014.

(30) Foreign Application Priority Data

Dec. 19, 2013  (CN) .......................... 2013 1 0705467

(51) Int. Cl.
  *G05F 1/00*   (2006.01)
  *H03K 7/06*   (2006.01)
  *H02M 3/158*  (2006.01)

(52) U.S. Cl.
  CPC ............ *H03K 7/06* (2013.01); *H02M 3/1584* (2013.01)

(58) Field of Classification Search
  CPC ............................... H02M 3/1584; H03K 7/06
  (Continued)

(56) References Cited

U.S. PATENT DOCUMENTS

| 4,374,426 A | 2/1983 | Burlage et al. |
| 7,772,821 B2 | 8/2010 | Liu et al. |

(Continued)

FOREIGN PATENT DOCUMENTS

| CN | 101795084 | 8/2010 |
| CN | 101873739 | 10/2010 |

(Continued)

OTHER PUBLICATIONS

Chinese Office Action dated Jan. 12, 2015 in corresponding Chinese Patent Application No. 201310705467.1.

(Continued)

*Primary Examiner* — Emily P Pham
*Assistant Examiner* — Alex Torres-Rivera
(74) *Attorney, Agent, or Firm* — Blakely, Sokoloff, Taylor & Zafman LLP

(57) ABSTRACT

A digital current equalization method includes: acquiring a current value from a counter preset value loading module in each synchronization period; generating a continuous variable frequency pulse according to the current value, and receiving a synchronization signal transmitted by a phase inverter connected to the PFM generator; transmitting, according to the synchronization signal, the continuous variable frequency pulse to the digital current equalization bus through an OC gate of a triode connected to the PFM generator; counting a frequency of the continuous variable frequency pulse on the digital current equalization bus, where an acquired frequency count value is used to represent a current magnitude of a power supply module, which currently outputs a greatest current, of the foregoing power supply module and a power supply module connected in parallel with the foregoing power supply module to accordingly adjust the output current of the foregoing power supply module.

10 Claims, 3 Drawing Sheets

(58) Field of Classification Search
USPC .................................. 323/269, 272; 363/69
See application file for complete search history.

(56) References Cited

U.S. PATENT DOCUMENTS

| | | | |
|---|---|---|---|
| 8,392,730 B2* | 3/2013 | He | H02J 1/102 |
| | | | 323/267 |
| 8,901,903 B2* | 12/2014 | Rinne | H02M 3/157 |
| | | | 323/272 |
| 2001/0043649 A1 | 11/2001 | Farjad-Rad | |
| 2002/0125869 A1* | 9/2002 | Groom | H02M 3/1584 |
| | | | 323/283 |
| 2008/0309300 A1* | 12/2008 | Liu | H02J 1/102 |
| | | | 323/272 |
| 2009/0058379 A1* | 3/2009 | Sreenivas | H02M 3/1584 |
| | | | 323/241 |
| 2011/0234193 A1 | 9/2011 | Laur et al. | |
| 2015/0130426 A1* | 5/2015 | Yang | H02M 3/157 |
| | | | 323/234 |

FOREIGN PATENT DOCUMENTS

| | | |
|---|---|---|
| CN | 102005903 | 4/2011 |
| CN | 103677028 | 3/2014 |
| DE | 19704662 A1 | 8/1998 |
| JP | 1997-214893 | 8/1997 |
| KR | 10-2005-0023832 | 3/2005 |
| WO | 98/35420 | 8/1998 |

OTHER PUBLICATIONS

PCT International Search Report dated Sep. 30, 2014 in corresponding International Patent Application No. PCT/CN2014/081837.

* cited by examiner

DIGITAL CURRENT EQUALIZATION METHOD AND POWER SUPPLY MODULE

CROSS-REFERENCE TO RELATED APPLICATIONS

This application is a continuation of International Application No. PCT/CN2014/081837, filed on Jul. 8, 2014, which claims priority to Chinese Patent Application No. 201310705467.1, filed on Dec. 19, 2013, both of which are hereby incorporated by reference in their entireties.

TECHNICAL FIELD

The present invention relates to circuit technologies, and in particular, to a digital current equalization method and a power supply module.

BACKGROUND

On many occasions when large currents are output, in order to improve system reliability, hot standby is used as a relatively common method, that is, multiple power supply modules are connected in parallel for use. Each power supply module is further provided with a hot swap function for the convenience of removing, repairing, and maintenance. However, internal resistance of the power supply modules is slightly different from each other, and output voltages cannot be identical, neither. Therefore, voltage sources with regulated voltage output cannot be connected in parallel directly, or even if connected in parallel, each module has different output power. It may occur that some power supply modules are working with overload, resulting in relatively severe loss and heat releasing and a shortened service life. However, some power supply modules that work with lightload even do not enter a relatively desirable working state, which is also harmful to service lives of the power supply modules.

In this case, a means is required to enable the output power of the modules to be substantially the same. This means by which loads are evenly distributed to the power supply modules is called current equalization. The current equalization may further be classified into analog current equalization and digital current equalization. The analog current equalization is a method in which current information is transmitted by using an analog signal so as to complete current equalization control on output of each power supply module. However, the analog current equalization method has the following problems: (1) because reference grounds belong to different rectifying modules, a ground potential difference directly affects current equalization accuracy; (2) a connection wire of a current equalization wire is long and is vulnerable to interference in an electromagnetic environment close to strong interference; (3) an analog component is greatly affected by temperature, which also affects the current equalization accuracy.

Because signals transmitted by the digital current equalization are 0 and 1, the digital current equalization is less affected by a ground potential and has strong anti-electromagnetic interference capability. Current equalization between different power supply modules can be achieved conveniently by modifying software, and hardware does not need to be changed, so compatibility is also very desirable. However, a digital current equalization technology requires a customized chip, which imposes a huge limitation on the digital current equalization technology regarding costs and universality.

SUMMARY

The present invention provides a digital current equalization method and a power supply module, so as to achieve digital current equalization without requiring a customized chip, thereby reducing costs on the digital current equalization and improving universality of the digital current equalization.

A first aspect of the present invention provides a digital current equalization method, including:

acquiring a current value from a counter preset value loading module in each synchronization period, where the current value is a value of output current magnitude of a power supply module in which the counter preset value loading module is located, and is used to represent a modulation frequency of a pulse frequency modulation (PFM) generator on the power supply module; and the synchronization period is a synchronization period of the PFM generator on the power supply module and a PFM generator on a power supply module connected in parallel to the power supply module;

generating a continuous variable frequency pulse according to the current value, and receiving a synchronization signal transmitted by a phase inverter connected to the PFM generator, where the synchronization signal is information about a synchronous updating time acquired by the phase inverter from a digital current equalization bus connected to the power supply module;

transmitting, according to the synchronization signal, the continuous variable frequency pulse to the digital current equalization bus through an open-collector gate of a triode connected to the PFM generator;

counting a frequency of the continuous variable frequency pulse on the digital current equalization bus, where an obtained frequency count value is used to represent a current magnitude of a power supply module that currently outputs a greatest current in the power supply module and the power supply module connected in parallel to the power supply module; and adjusting the output current of the power supply module according to the current magnitude of the power supply module that currently outputs the greatest current.

With reference to the first aspect, in a first possible implementation manner of the first aspect, where the transmitting, according to the synchronization signal, the continuous variable frequency pulse to the digital current equalization bus, which is connected to the power supply module, through an open-collector gate of a triode connected to the PFM generator includes:

if the frequency of the continuous variable frequency pulse is greater than or equal to a frequency of the synchronization signal, transmitting the continuous variable frequency pulse to the digital current equalization bus, which is connected to the power supply module, through the open-collector gate of the triode connected to the PFM generator.

With reference to the first possible implementation manner of the first aspect, in a second possible implementation manner of the first aspect, the method further includes:

if the frequency of the continuous variable frequency pulse is less than the frequency of the synchronization signal, resetting the PFM generator at a time when the synchronization signal is received to start a new synchronization period, and re-acquiring the current value from the counter preset value loading module.

With reference to the first aspect, or the first or second possible implementation manner of the first aspect, in a third possible implementation manner of the first aspect, a larger output current of the power supply module results in a higher frequency of the continuous variable frequency pulse.

With reference to the first aspect, or the first or second possible implementation manner of the first aspect, in a fourth possible implementation manner of the first aspect, the adjusting the output current of the power supply module according to the current magnitude of the power supply module that currently outputs the greatest current includes:

comparing the current magnitude of the power supply module that currently outputs the greatest current with magnitude of the output current of the power supply module, and when the output current of the power supply module is relatively larger, reducing an output voltage of the power supply module so as to reduce the output current of the power supply module; and when the output current of the power supply module is relatively smaller, increasing the output voltage of the power supply module so as to increase the output current of the power supply module.

A second aspect of the present invention provides a power supply module, including: a pulse frequency modulation (PFM) generator, a counter preset value loading module, a period counter, a microcontroller, and a phase inverter; where the phase inverter is connected to the PFM generator;

the PFM generator is configured to: acquire a current value from the counter preset value loading module in each synchronization period, where the current value is a value of output current magnitude of the power supply module, and is used to represent a modulation frequency of the PFM generator, and the synchronization period is a synchronization period of the PFM generator on the power supply module and a PFM generator on a power supply module connected in parallel to the power supply module; generate a continuous variable frequency pulse according to the current value, and receive a synchronization signal transmitted by the phase inverter, where the synchronization signal is information about a synchronous updating time acquired by the phase inverter from a digital current equalization bus connected to the power supply module; and transmit, according to the synchronization signal, the continuous variable frequency pulse to the digital current equalization bus through an open-collector gate of a triode connected to the PFM generator;

the period counter is configured to count a frequency of the continuous variable frequency pulse on the digital current equalization bus, where an obtained frequency count value is used to represent current magnitude of a power supply module that currently outputs a greatest current in the power supply module and the power supply module connected in parallel to the power supply module; and the microcontroller is configured to adjust the output current of the power supply module according to the current magnitude, obtained by the period counter, of the power supply module that currently outputs the greatest current.

With reference to the second aspect, in a first possible implementation manner of the second aspect, the PFM generator is specifically configured to transmit, when the frequency of the continuous variable frequency pulse is greater than or equal to a frequency of the synchronization signal, the continuous variable frequency pulse to the digital current equalization bus, which is connected to the power supply module, through the open-collector gate of the triode connected to the PFM generator.

With reference to the first possible implementation manner of the second aspect, in a second possible implementation manner of the second aspect, the PFM generator is further configured to be reset, when the frequency of the continuous variable frequency pulse is less than the frequency of the synchronization signal, at a time when the synchronization signal is received to start a new synchronization period, and re-acquire the current value from the counter preset value loading module.

With reference to the second aspect, or the first or second possible implementation manner of the second aspect, in a third possible implementation manner of the second aspect, a larger output current of the power supply module results in a higher frequency of the continuous variable frequency pulse generated by the PFM generator.

With reference to the second aspect, or the first or second possible implementation manner of the second aspect, in a fourth possible implementation manner of the second aspect, the microcontroller is specifically configured to compare the current magnitude of the power supply module that currently outputs the greatest current with magnitude of the output current of the power supply module, and when the output current of the power supply module is relatively larger, reduce an output voltage of the power supply module so as to reduce the output current of the power supply module; and when the output current of the power supply module is relatively smaller, increase the output voltage of the power supply module so as to increase the output current of the power supply module.

By using the technical solutions provided in the present invention, firstly, a current value is acquired from a counter preset value loading module in each synchronization period, a continuous variable frequency pulse is generated according to the foregoing current value, and a synchronization signal transmitted by a phase inverter connected to a PFM generator is received; secondly, the foregoing continuous variable frequency pulse is transmitted, according to the synchronization signal, to the foregoing digital current equalization bus through an open-collector gate of a triode connected to the PFM generator; thirdly, a frequency of the continuous variable frequency pulse on the foregoing digital current equalization bus is counted, where an obtained frequency count value is used to represent current magnitude of a power supply module that currently outputs a greatest current in the power supply module and a power supply module connected in parallel to the power supply module; and finally, the output current of the power supply module is adjusted according to the current magnitude of the power supply module that currently outputs the greatest current; in this way, it can be achieved that current equalization control is performed on each power supply module, which is connected in parallel, by using the digital current equalization bus, and in addition, a carrier for the foregoing digital current equalization bus to exchange information is a pulse frequency. In this way, the digital current equalization can be achieved without requiring a customized chip, so as to reduce costs of the digital current equalization and improve universality of the digital current equalization.

BRIEF DESCRIPTION OF DRAWINGS

To describe the technical solutions in the embodiments of the present invention more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

Figure 1:
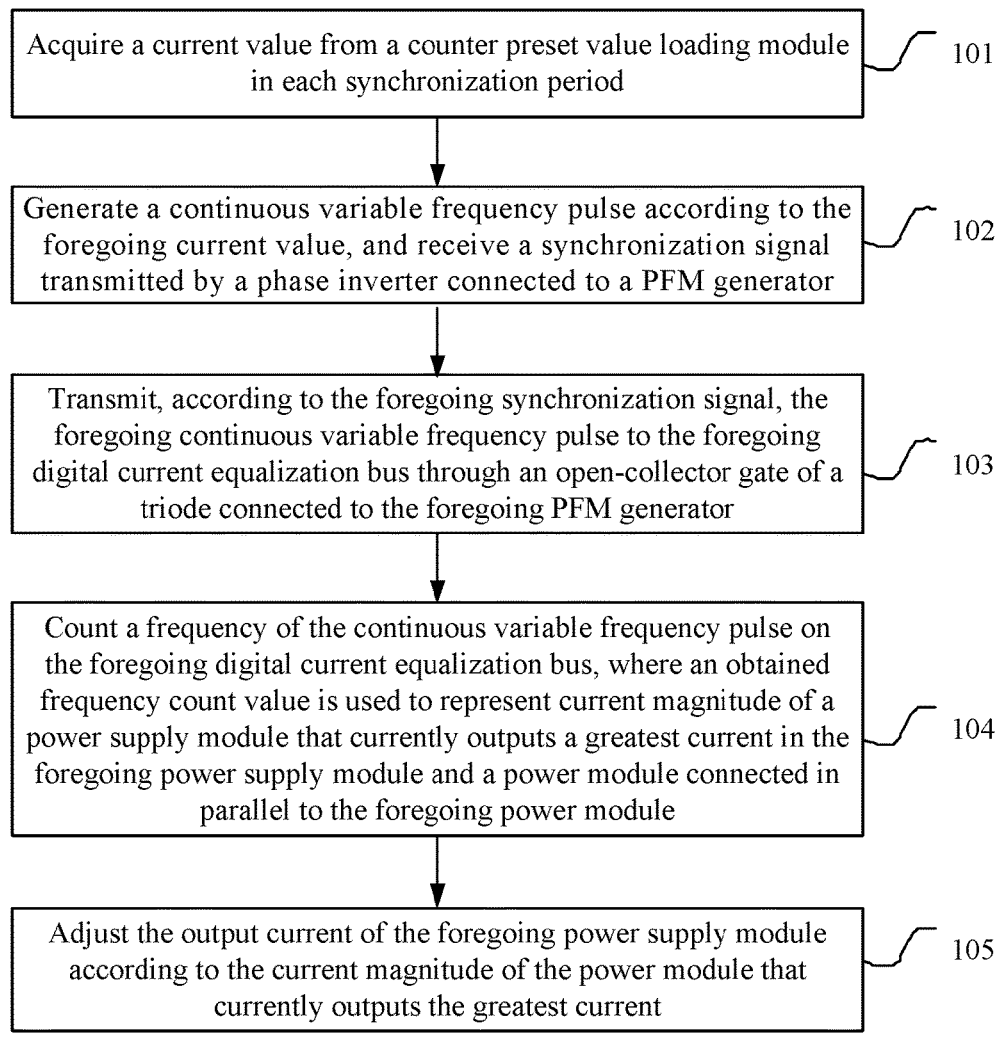
FIG. 1 is a flowchart of an embodiment of a digital current equalization method according to the present invention.

FIG. 1 is a flowchart of an embodiment of a digital current equalization method according to the present invention, and as shown in FIG. 1, the digital current equalization method may include:

Step 101: Acquire a current value from a counter preset value loading module in each synchronization period.

The foregoing current value is a value of output current magnitude of a power supply module in which the foregoing counter preset value loading module is located, and is used to represent a modulation frequency of a pulse frequency modulation (pulse frequency modulation, hereinafter referred to as: PFM) generator on the foregoing power supply module; and the foregoing synchronization period is a synchronization period of the PFM generator on the foregoing power supply module and a PFM generator on a power supply module connected in parallel to the foregoing power supply module.

Step 102: Generate a continuous variable frequency pulse according to the foregoing current value, and receive a synchronization signal transmitted by a phase inverter connected to the foregoing PFM generator.

The foregoing synchronization signal is information about a synchronous updating time acquired by the phase inverter from a digital current equalization bus connected to the power supply module.

Step 103: Transmit, according to the foregoing synchronization signal, the foregoing continuous variable frequency pulse to the foregoing digital current equalization bus through an open-collector (OC) gate of a triode connected to the foregoing PFM generator.

Step 104: Count a frequency of the continuous variable frequency pulse on the foregoing digital current equalization bus, where an obtained frequency count value is used to represent current magnitude of a power supply module that currently outputs a greatest current in the foregoing power supply module and the power supply module connected in parallel to the foregoing power supply module.

Step 105: Adjust the output current of the foregoing power supply module according to the current magnitude of the power supply module that currently outputs the greatest current.

In this embodiment, step 103 may be as follows:

if the frequency of the foregoing continuous variable frequency pulse is greater than or equal to a frequency of the synchronization signal, transmitting the foregoing continuous variable frequency pulse to the digital current equalization bus, which is connected to the foregoing power supply module, through the OC gate of the triode connected to the foregoing PFM generator; and if the frequency of the foregoing continuous variable frequency pulse is less than the frequency of the foregoing synchronization signal, resetting the PFM generator at a time when the foregoing synchronization signal is received to start a new synchronization period, and re-acquire the foregoing current value from the foregoing counter preset value loading module.

In this embodiment, a larger output current of the foregoing power supply module results in a higher frequency of the foregoing continuous variable frequency pulse.

In this embodiment, step 105 may be as follows: compare the current magnitude of the power supply module that currently outputs the greatest current with magnitude of the output current of the power supply module, and when the output current of the power supply module is relatively larger, reduce an output voltage of the foregoing power supply module so as to reduce the output current of the foregoing power supply module; and when the output current of the power supply module is relatively smaller, increase the output voltage of the foregoing power supply module so as to increase the output current of the foregoing power supply module.

The foregoing embodiment can achieve that current equalization control is performed on each power supply module, which is connected in parallel, by using the digital current equalization bus, and in addition, a carrier for the foregoing digital current equalization bus to exchange information is a pulse frequency. In this way, digital current equalization can be achieved without requiring a customized chip, so as to reduce costs of the digital current equalization and improve universality of the digital current equalization.

Figure 2:
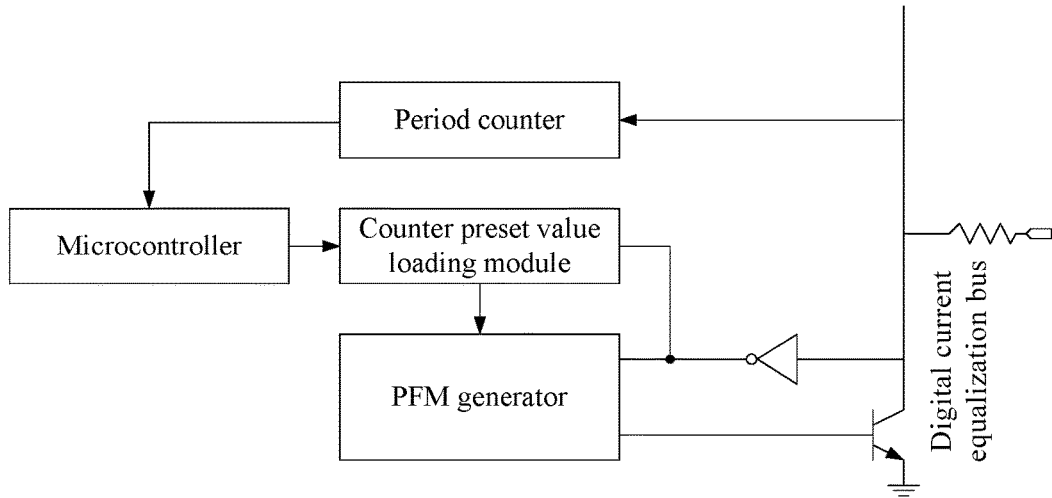
FIG. 2 is an implementation block diagram of another embodiment of a digital current equalization method according to the present invention.

FIG. 2 is an implementation block diagram of another embodiment of the digital current equalization method according to the present invention. In the present invention, current equalization control of each power supply module connected in parallel exchanges information through a digital current equalization bus, and a carrier for exchanging information through the foregoing digital current equalization bus is a pulse frequency. In this embodiment, each power supply module is connected in parallel by using the foregoing digital current equalization bus.

As shown in FIG. 2, the information exchanged on the digital current equalization bus by each power supply module is generated by a counter preset value loading module, a PFM generator, and a period counter of each power supply module.

A microcontroller on the power supply module converts magnitude of an output current of the foregoing power supply module to a current value, and transmits the current value to the foregoing counter preset value loading module.

The PFM generator acquires the foregoing current value from the foregoing counter preset value loading module in each synchronization period, where the foregoing value indicates a modulation frequency of the PFM generator; and then, the PFM generator generates a continuous variable frequency pulse according to the foregoing current value, and receives a synchronization signal transmitted by a phase inverter connected to the foregoing PFM generator, where the foregoing synchronization signal is information about a synchronous updating time acquired by the phase inverter from the digital current equalization bus connected to the power supply module. Then, the PFM generator transmits, according to the foregoing synchronization signal, the foregoing continuous variable frequency pulse to the foregoing digital current equalization bus through an open-collector (OC) gate of a triode connected to the foregoing PFM generator.

The foregoing period counter counts a frequency on the digital current equalization bus, where an obtained frequency count value is used to represent current magnitude of a power supply module that currently outputs a greatest current in the power supply modules connected in parallel.

Finally, the microcontroller compares the current magnitude, obtained by the foregoing period counter, of the power supply module that currently outputs the greatest current with the magnitude of the output current of the foregoing power supply module, and adjusts an output voltage of the foregoing power supply module, and when the output current of the foregoing power supply module is relatively larger, the output voltage of the foregoing power supply module is reduced so as to reduce the output current of the foregoing power supply module; and when the output current of the foregoing power supply module is relatively smaller, the output voltage of the foregoing power supply module is increased so as to increase the output current of the foregoing power supply module. In this manner, current equalization of each module connected in parallel is implemented.

The synchronization signal transmitted by the foregoing phase inverter is a synchronous loading signal of the counter preset value loading module for the PFM generator, and is also a reset signal of the PFM generator.

In the present invention, because a trigger source of a reset signal of a PFM generator on each power supply module comes from a same digital current equalization bus, the PFM generators on the power supply modules can be reset synchronously. A result of this is that a PFM generator with a low output frequency is synchronized by a PFM generator with a high output frequency.

In the present invention, a larger output current of a power supply module in which the PFM generator is located results in a higher output frequency of the foregoing PFM generator.

Figure 3:
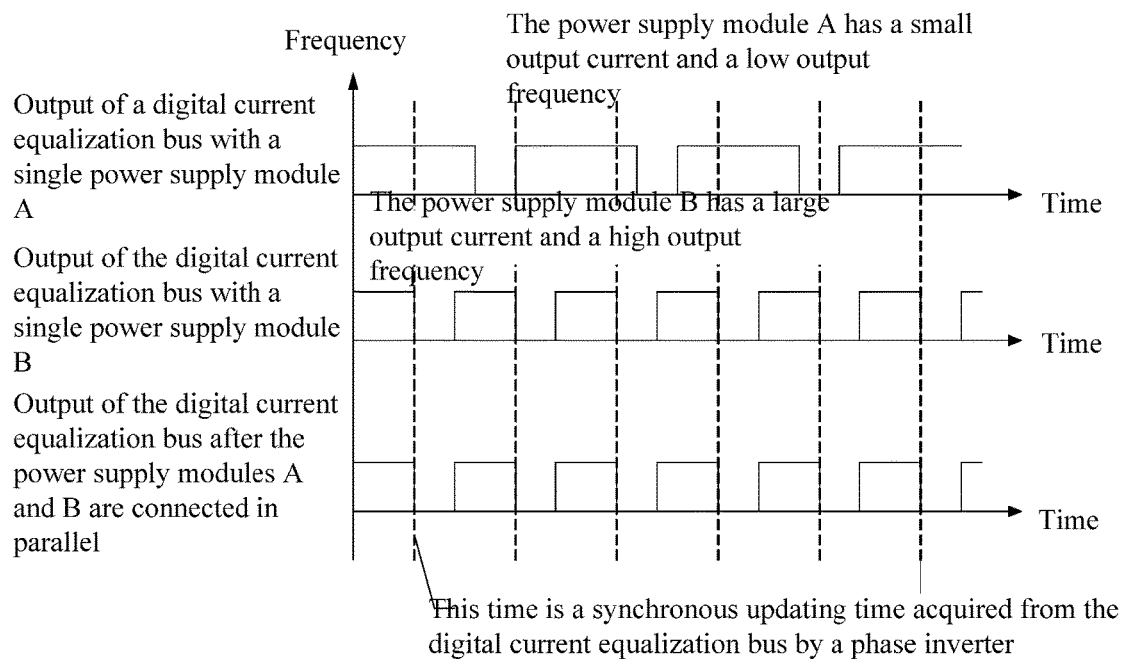
FIG. 3 a timing diagram of acquiring, by a phase inverter, a synchronous updating time from a digital current equalization bus according to the present invention.

FIG. 3 a timing diagram of acquiring, by a phase inverter, a synchronous updating time from a digital current equalization bus according to the present invention. As shown in FIG. 3, the phase inverter detects a falling edge of the digital current equalization bus, and use a time corresponding to the falling edge of the digital current equalization bus as a synchronous updating time. Then, the phase inverter uses information about the synchronous updating time as a synchronization signal, and transmits the synchronization signal to the foregoing PFM generator and the foregoing counter preset value loading module, so as to trigger clearing of a count value of the PFM generator, and re-acquires a current value representing current magnitude of a power supply module from the foregoing counter preset value loading module, so as to achieve synchronization of each power supply module connected in parallel. In FIG. 3, a power supply module A and a power supply module B are two power supply modules connected in parallel. Because a trigger source of a reset signal of a PFM generator on each power supply module connected in parallel comes from a same digital current equalization bus, the PFM generators on the power supply modules can be reset synchronously. A result of this is that a PFM generator with a low output frequency is synchronized by a PFM generator with a high output frequency. In addition, in the present invention, a larger output current of a power supply module in which the PFM generator is located results in a higher output frequency of the PFM generator. As shown in FIG. 3, an output current of the power supply module A is small, so that an output frequency of a PFM generator of the power supply module A is relatively lower, but an output current of the power supply module B is large, so that an output frequency of a PFM generator of the power supply module B is relatively higher, and therefore, the PFM generator of the power supply module A is synchronized by the PFM generator of the power supply module B. In this way, synchronous updating times acquired by phase inverters of the power supply module A and the power supply module B from the digital current equalization bus are both a time corresponding to a falling edge of the output frequency of the power supply module B.

Next, the PFM generator generates a continuous variable frequency pulse according to the foregoing current value, and transmits the generated continuous variable frequency pulse to the digital current equalization bus through an OC gate of a triode connected to the PFM generator. Because of a wired-AND function of the OC gate, a frequency reflected on the digital current equalization bus is always current information of a power supply module that currently outputs a greatest current in the power supply modules connected in parallel.

In addition, because output of the PFM generator is output through a collector of the triode, when the PFM generator is faulty, the output is high resistance, the PFM generator is separated from the digital current equalization bus, and no impact is imposed on the digital current equalization bus when hot plugging is performed.

Figure 4:
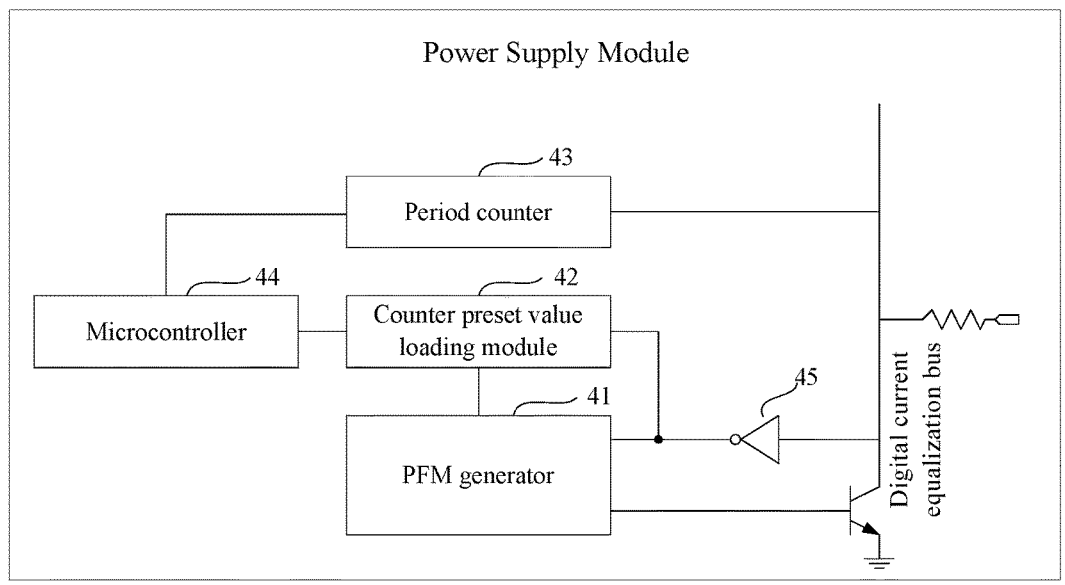
FIG. 4 is a schematic structural diagram of an embodiment of a power supply module according to the present invention.

FIG. 4 is a schematic structural diagram of an embodiment of a power supply module according to the present invention. As shown in FIG. 4, a digital current equalization apparatus includes: a PFM generator 41, a counter preset value loading module 42, a period counter 43, a microcontroller 44, and a phase inverter 45, where the foregoing phase inverter 45 is connected to the PFM generator 41.

The PFM generator 41 is configured to: acquire a current value from the counter preset value loading module 42 in each synchronization period, where the foregoing current value is a value of output current magnitude of the foregoing power supply module, and is used to represent a modulation frequency of the foregoing PFM generator 41, and the foregoing synchronization period is a synchronization period of the PFM generator on the foregoing power supply module and a PFM generator on a power supply module connected in parallel to the foregoing power supply module; generate a continuous variable frequency pulse according to the foregoing current value, and receive a synchronization signal transmitted by the foregoing phase inverter 45, where the foregoing synchronization signal is information about a synchronous updating time acquired by the foregoing phase inverter 45 from a digital current equalization bus connected to the foregoing power supply module; and transmit, according to the foregoing synchronization signal, the foregoing continuous variable frequency pulse to the foregoing digital current equalization bus through an OC gate of a triode connected to the PFM generator 41.

The period counter 43 is configured to count a frequency of the continuous variable frequency pulse on the foregoing digital current equalization bus, where an obtained frequency count value is used to represent current magnitude of a power supply module that currently outputs a greatest current in the foregoing power supply module and the power supply module connected in parallel to the foregoing power supply module.

The microcontroller 44 is configured to adjust the output current of the foregoing power supply module according to the current magnitude, obtained by the period counter 43, of the power supply module that currently outputs the greatest current.

In this embodiment, the PFM generator 41 is specifically configured to transmit, when the frequency of the foregoing continuous variable frequency pulse is greater than or equal to a frequency of the synchronization signal, the foregoing continuous variable frequency pulse to the digital current equalization bus, which is connected to the foregoing power supply module, through the OC gate of the triode connected to the PFM generator 41.

Further, the PFM generator 41 is further configured to be reset, when the frequency of the foregoing continuous variable frequency pulse is less than the frequency of the foregoing synchronization signal, at a time when the foregoing synchronization signal is received to start a new synchronization period, and re-acquire the foregoing current value from the counter preset value loading module 42.

In this embodiment, a larger output current of the foregoing power supply module results in a higher frequency of the continuous variable frequency pulse generated by the PFM generator 41.

In this embodiment, the microcontroller 44 is specifically configured to compare the current magnitude of the power supply module that currently outputs the greatest current with the magnitude of the output current of the foregoing power supply module, and when the output current of the foregoing power supply module is relatively larger, reduce an output voltage of the foregoing power supply module so as to reduce the output current of the foregoing power supply module; and when the output current of the foregoing power supply module is relatively smaller, increase the output voltage of the foregoing power supply module so as to increase the output current of the foregoing power supply module.

The foregoing power supply module can achieve that current equalization control is performed on each power supply module, which is connected in parallel, by using the digital current equalization bus, and in addition, a carrier for the digital current equalization bus to exchange information is a pulse frequency. In this way, the digital current equalization can be achieved without requiring a customized chip, so as to reduce costs of the digital current equalization and improve universality of the digital current equalization.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A digital current equalization method, comprising:
   acquiring a current value from a counter preset value loading module in each synchronization period, wherein the current value is a value of an output current magnitude of a first power supply module in which the counter preset value loading module is located, and is used to represent a modulation frequency of a first pulse frequency modulation (PFM) generator on the first power supply module; and
   the synchronization period is a synchronization period of the first PFM generator on the first power supply module and a second PFM generator on a second power supply module connected in parallel to the first power supply module;
   generating a continuous variable frequency pulse according to the current value, and receiving a synchronization signal transmitted by a phase inverter connected to the first PFM generator, wherein the synchronization signal is information about a synchronous updating time acquired by the phase inverter from a digital current equalization bus connected to the first power supply module;
   transmitting, according to the synchronization signal, the continuous variable frequency pulse to the digital current equalization bus through an open-collector gate of a triode connected to the first PFM generator;
   counting a frequency of the continuous variable frequency pulse on the digital current equalization bus, wherein an obtained frequency count value is used to represent a current magnitude of a power supply module that currently outputs a greatest current among the first power supply module and the second power supply module connected in parallel; and
   adjusting an output current of the first power supply module according to the current magnitude of the power supply module among the first power supply module and the second power supply module connected in parallel that currently outputs the greatest current.

2. The method according to claim 1, wherein the transmitting, according to the synchronization signal, the continuous variable frequency pulse to the digital current equalization bus, which is connected to the first power supply module, through the open-collector gate of the triode connected to the first PFM generator comprises:
   if the frequency of the continuous variable frequency pulse is greater than or equal to a frequency of the synchronization signal, transmitting the continuous variable frequency pulse to the digital current equalization bus, which is connected to the first power supply module, through the open-collector gate of the triode connected to the first PFM generator.

3. The method according to claim 2, wherein the transmitting, according to the synchronization signal, the continuous variable frequency pulse to the digital current equalization bus, which is connected to the first power supply module, through the open-collector gate of the triode connected to the first PFM generator further comprising:
   if the frequency of the continuous variable frequency pulse is less than the frequency of the synchronization signal, resetting the first PFM generator at a time when the synchronization signal is received to start a new synchronization period, and re-acquiring the current value from the counter preset value loading module.

4. The method according to claim 1 wherein a larger output current of the first power supply module results in a higher frequency of the continuous variable frequency pulse.

5. The method according to claim 1, wherein the adjusting the output current of the first power supply module according to the current magnitude of the power supply module that currently outputs the greatest current among the first power supply module and the second power supply module connected in parallel comprises:
   comparing the current magnitude of the power supply module that currently outputs the greatest current with magnitude of the output current of the first power supply module, and when the output current of the first power supply module is relatively larger, reducing an output voltage of the first power supply module so as to reduce the output current of the first power supply module; and when the output current of the first power supply module is relatively smaller, increasing the output voltage of the first power supply module so as to increase the output current of the first power supply module.

6. A power supply system, comprising:

a first pulse frequency modulation (PFM) generator, a counter preset value loading module, a period counter, a microcontroller, and a phase inverter;

wherein the phase inverter is connected to the first PFM generator;

the first PFM generator is configured to:

acquire a current value from the counter preset value loading module in each synchronization period, wherein the current value is a value of an output current magnitude of a first power supply module, and is used to represent a modulation frequency of the first PFM generator, and the synchronization period is a synchronization period of the first PFM generator on the power supply module and a second PFM generator on a second power supply module connected in parallel to the first power supply module;

generate a continuous variable frequency pulse according to the current value, and receive a synchronization signal transmitted by the phase inverter, wherein the synchronization signal is information about a synchronous updating time acquired by the phase inverter from a digital current equalization bus connected to the first power supply module; and transmit, according to the synchronization signal, the continuous variable frequency pulse to the digital current equalization bus through an open-collector gate of a triode connected to the first PFM generator;

the period counter is configured to count a frequency of the continuous variable frequency pulse on the digital current equalization bus, wherein an obtained frequency count value is used to represent a current magnitude of a power supply module that currently outputs a greatest current among the first power supply module and the second power supply module connected in parallel; and the microcontroller is configured to adjust an output current of the first power supply module according to the current magnitude, obtained by the period counter, of the power supply module among the first power supply module and the second power supply module connected in parallel that currently outputs the greatest current.

7. The power supply system according to claim 6, wherein:

the first PFM generator is specifically configured to transmit, when the frequency of the continuous variable frequency pulse is greater than or equal to a frequency of the synchronization signal, the continuous variable frequency pulse to the digital current equalization bus, which is connected to the first power supply module, through the open-collector gate of the triode connected to the first PFM generator.

8. The power supply system according to claim 7, wherein: the first PFM generator is further configured to be reset, when the frequency of the continuous variable frequency pulse is less than the frequency of the synchronization signal, at a time when the synchronization signal is received to start a new synchronization period, and re-acquire the current value from the counter preset value loading module.

9. The power supply system according to claim 6, wherein a larger output current of the first power supply module results in a higher frequency of the continuous variable frequency pulse generated by the first PFM generator.

10. The power supply system according to claim 6, wherein: the microcontroller is specifically configured to compare the current magnitude of the power supply module that currently outputs the greatest current among the first power supply module and the second power supply module connected in parallel with magnitude of the output current of the first power supply module, and when the output current of the first power supply module is relatively larger, reduce an output voltage of the first power supply module so as to reduce the output current of the first power supply module; and when the output current of the first power supply module is relatively smaller, increase the output voltage of the first power supply module so as to increase the output current of the first power supply module.

* * * * *